(12) United States Patent
Bertness

(10) Patent No.: US 6,534,993 B2
(45) Date of Patent: Mar. 18, 2003

(54) ELECTRONIC BATTERY TESTER

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/143,307

(22) Filed: May 10, 2002

(65) Prior Publication Data

US 2002/0163338 A1 Nov. 7, 2002

Related U.S. Application Data

(62) Division of application No. 09/876,564, filed on Jun. 7, 2001, now Pat. No. 6,392,414, which is a division of application No. 09/280,133, filed on Mar. 26, 1999, now Pat. No. 6,310,481, which is a division of application No. 09/006,226, filed on Jan. 12, 1998, now Pat. No. 5,914,605.
(60) Provisional application No. 60/035,312, filed on Jan. 13, 1997.

(51) Int. Cl.$^7$ ............................................. G01N 27/416
(52) U.S. Cl. ....................................................... 324/433
(58) Field of Search .................................. 324/433, 432, 324/426

(56) References Cited

U.S. PATENT DOCUMENTS

| | | | | |
|---|---|---|---|---|
| 5,914,605 A | * | 6/1999 | Bertness | 320/161 |
| 6,310,481 B2 | * | 10/2001 | Bertness | 320/161 |
| 6,392,414 B2 | * | 5/2002 | Bertness | 324/429 |

* cited by examiner

Primary Examiner—Gregory J. Toatley, Jr.
(74) Attorney, Agent, or Firm—Westman, Champlin & Kelly, P.A.

(57) ABSTRACT

A microprocessor couples to a voltage sensor through an analog to digital converter. The voltage sensor is adapted to be coupled across terminals of a battery. A small current source is also provided and adapted to be coupled across the terminal to the battery. The current source is momentarily applied to the battery and the resulting change in voltage is monitored using the microprocessor. The microprocessor calculates battery conductance based upon the magnitude of the differential current and the change in voltage and thereby determines the condition of the battery.

28 Claims, 5 Drawing Sheets

ELECTRONIC BATTERY TESTER

The present invention is a Divisional of application Ser. No. 09/876,564, filed Jun. 7, 2001, now U.S. Pat. No. 6,392,414, which is a Divisional of application Ser. No. 09/280,133, filed Mar. 26, 1999, now U.S. Pat. No. 6,310,481, which is a Divisional application of application Ser. No. 09/006,226, filed Jan. 12, 1998, now U.S. Pat. No. 5,914,605, which claims priority to Provisional Application Ser. No. 60/035,312, filed Jan. 13, 1997 and entitled "ELECTRONIC BATTERY TESTER."

BACKGROUND OF THE INVENTION

The present invention relates to battery testing devices. The present invention is particularly applicable to a technique for measuring conductance of a battery in which a small resistive load is momentarily placed across the battery and the change in voltage is monitored.

Chemical storage batteries, such as lead acid batteries used in automobiles, have existed for many years. In order to make optimum use of such a battery, it is very desirable to test the battery to determine various battery parameters such as state of charge, battery capacity, state of health, the existence of battery defects.

Various techniques have been used to measure battery parameters. For example, hygrometers have been used to measure the specific gravity of a battery and simple voltage measurements have been used to monitor the voltage of the battery. One battery testing technique which has been popular for many years is known as a load test in which a battery is heavily loaded over a period of time and the decay in the battery output is monitored. However, such a test is time consuming and leaves the battery in a relatively discharged condition. Further, such a tester must be made relatively large if it is to be used with large batteries.

A much more elegant technique has been pioneered by Midtronics, Inc. of Burr Ridge, Ill. and Dr. Keith S. Champlin in which battery parameters are determined based upon a measurement of the battery's conductance. This work is set forth in, for example, the following patents issued to Champlin: U.S. Pat. Nos. 3,873,911; 3,909,708; 4,816,768; 4,825,170; 4,881,038; 4,912,416; 5,140,269; 5,343,380; 5,572;136 and U.S. Pat. No. 5,585,728 and the following patents assigned to Midtronics, Inc., U.S. Pat. Nos. 5,574,355 and 5,592,093.

However, there is an ongoing need to refine battery testing techniques, improve their accuracy and improve the types of applications in which they may be successfully employed.

SUMMARY OF THE INVENTION

A microprocessor couples to a voltage sensor through an analog to digital converter. The voltage sensor is adapted to be coupled across terminals of a battery. A small current source is also provided and adapted to be coupled across the terminal to the battery. The current source is momentarily switched on to provide a current (which may be a current drop) through the battery and the resulting change in voltage is monitored using the microprocessor. The microprocessor calculates battery conductance based upon the magnitude of the current and the change in voltage. These techniques are employed to overcome noise from noise sources which may be coupled to the battery during the battery test.

DETAILED DESCRIPTION OF THE PREFERRED EMBODIMENTS

It has been discovered that measuring battery conductance of a storage battery connected to noise sources is a particularly difficult problem. Such noise sources include the charging system and various electronics in an automobile, for example, or other types of charging systems and electronics which may be connected to storage batteries. These noise sources interfere with the battery test. The present invention includes a number of techniques to overcome the limitations imposed by such noise.

Figure 1:
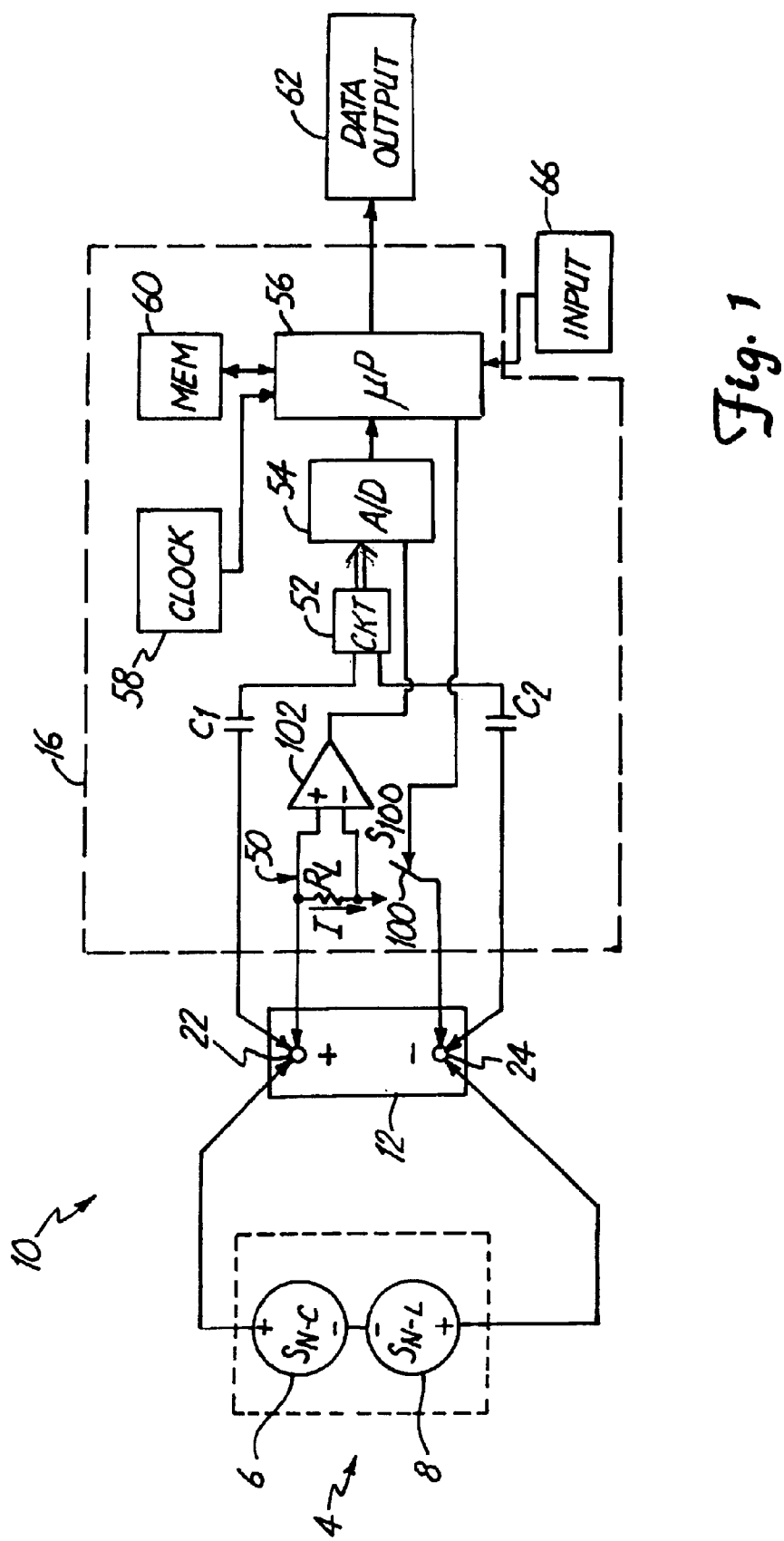
FIG. 1 is a simplified electrical schematic diagram of a battery tester in accordance with the present invention.

FIG. 1 is simplified block diagram of a battery tester 10 in accordance with the present invention coupled to an electrical system 4. electrical system 4 is an model which includes a charge signal noise source 6 and a load signal noise source 8. These sources could be, for example, the load and charger of an automobile or a uninterruptable power system (UPS).

Battery tester 10 determines the conductance of battery 12 in accordance with the present invention and includes test circuitry 16. Circuitry 16 includes a current source 50 (which comprises, for example, a resistance $R_L$), sensor circuitry 52, analog to digital converter 54 and microprocessor 56. In one preferred embodiment, microprocessor 56 comprises a Motorola MC 68HC705C8P. Sensor circuitry 52 is capacitively coupled to battery 12 through capacitors C1 and C2 and has its outputs connected to a multiplexed or input of analog to digital converter 54. A/D converter 54 is also connected to microprocessor 56 which connects to system clock 58, memory 60, output 62 and input 66. Output 62 comprises, for example, a display and input 66 may comprise a keyboard, RF link, bar code reader, etc.

In operation, current source 50 is controlled by microprocessor 56 using switch 100 which may comprise, for example, a FET. Current source 50 provides a current I in the direction shown by the arrow in FIG. 1. In one embodiment, this is a square wave or a pulse. The voltage sense circuitry 52 connects to terminals 22 and 24 of battery 12 to capacitors C1 and C2, respectively, and provides an output related to the voltage difference between the terminals. Sense circuitry 52 preferably has a high input impedance. Note that circuitry 16 is connected to battery 12 through a four point connection technique known as a Kelvin connection Because very little current flows through circuitry 52, the voltage drop through its connections to battery 12 is relatively insignificant. The output of circuitry 52 is converted to a digital format and provided to microprocessor 56. Microprocessor 56 operates at a frequency determined by system clock 58 and in accordance with program instructions stored in memory 60.

Figure 2:
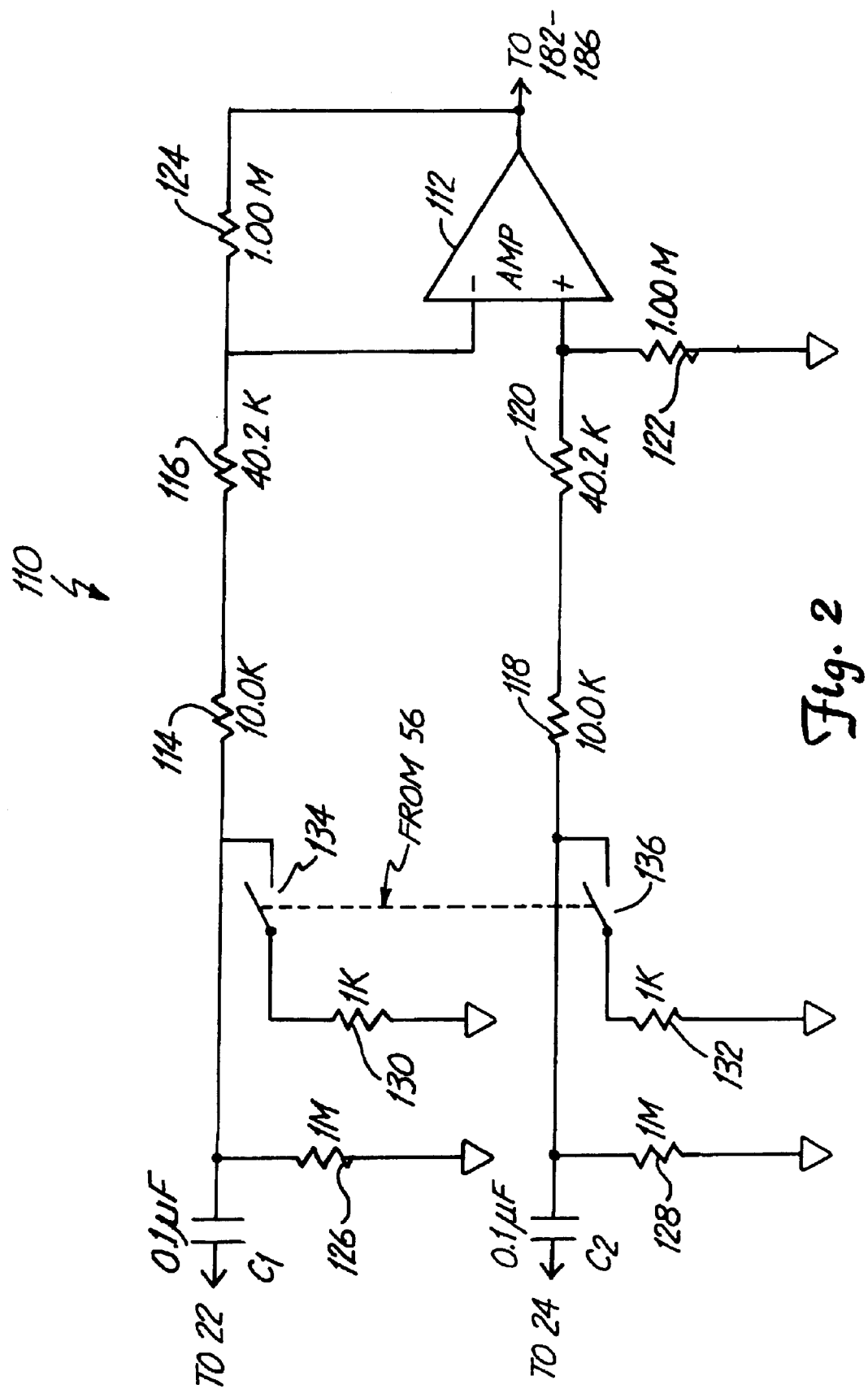
FIG. 2 is a simplified electrical schematic diagram of a portion of sense circuitry shown in FIG. 1.

In general, microprocessor 56 determines the conductance of battery 12 by actuating switch 100 to apply a current pulse with current source 50. The microprocessor determines the change in battery voltage due to the current pulse using circuitry 52 and analog to digital converter 54. The value of current I generated by current source 50 is measured by measuring the voltage drop across resistance $R_L$ using amplifier 102. Microprocessor 56 calculates the conductance of battery 12 as follows:

$$\text{Conductance} = G = \frac{\Delta I}{\Delta V} \qquad \text{Equation 1}$$

where ΔI is the change in current flowing through battery 12 due to current source 5o, and ΔV is the change in battery voltage due to applied current ΔI. The relative conductance of battery 12, as discussed with respect to FIG. 2, is calculated using the equation:

$$\text{Relative Conductance (\%)} = \frac{G_{measured}}{G_{reference}} \times 100 \qquad \text{Equation 2}$$

where $G_{measured}$ is the battery conductance in accordance with Equation 1 and $G_{reference}$ is a reference conductance value received through input 66 and stored in memory 60. Generally, this reference conductance is determined based upon the type and characteristics of battery 12. Microprocessor 56 can also operate using impedance measurements by inverting Equations 1 and 2. The relative conductance measurement may then be output using data output 62 which may comprise, for example, a display, meter, data link, etc.

The measurement of conductance in a noisy environment using circuitry 16 may be accomplished by maintaining a relatively short connection of resistance $R_L$ across battery 12 and measuring the resultant small voltage drop. The DC voltage drop across the battery is a minimum of 2 volts and the absolute voltage drop across the battery may be any value. Sense circuitry 52 preferably has a relatively large gain which is saturated if circuitry 52 is directly coupled to battery 12. Therefore, capacitors C1 and C2 are provided to capacitively coupled circuitry 52 to battery 12.

FIG. 2 is a simplified electrical schematic diagram 110 of a portion of sense circuitry 52 shown in FIG. 1. Circuitry 100 includes differential amplifier 112 having an inverting input connected to terminal 22 of battery 12 through capacitor C1 and resistors 114 and 116 having values of 10 KΩ and 40.2 KΩ. The non-inverting input of amplifier 112 connects to terminal 24 through capacitor C2 and resistors 118 and 120 having values of 10 KΩ and 40.2 KΩ, respectively. The non-inverting input of amplifier 112 connects to electrical ground through resistor 122 having a value of 1 MΩ feedback is provided from the output of amplifier 112 through resistor 124 having a value of 1 MΩ. Capacitors C1 and C2 have values of 0.1 μF and are ground through resistors 126 and 128 which have a value of 1 MΩ. Low impedance path resistors 130 and 132 have values of 1 KΩ and are selectively coupled to capacitors C1 and C2 through switches 134 and 136, respectively. Switches 134 and 136 may comprise, for example, FETs which are controlled by microprocessor 56.

In order to make accurate AC transient measurements, it is necessary that the bias voltage across the input coupling capacitors C1 and C2 remains relatively constant. This is facilitated by using relatively large capacitor values for C1 and C2 and employing coupled to a high input impedance circuit for circuit 52 However, a significant drawback to the high impedance is that a relatively long time is required for the amplifier to stabilize to a quiescent operating point when the tester is first started or relocated to a different battery. Resistors 130 and 132 provide a relatively low impedance path to electrical ground when switches 134 and 136, respectively, are actuated by microprocessor 56. Preferably, the switches 134 and 136 are actuated just prior to measurements to thereby quickly establish the operating point of the system. A further advantage of application of the low impedance paths during a non-test interval is that they allow quiescent operating points that are elevated (or depressed) due to system noise, thereby placing no practical limit on the amount of low frequency noise that can be rejected.

Figure 3:
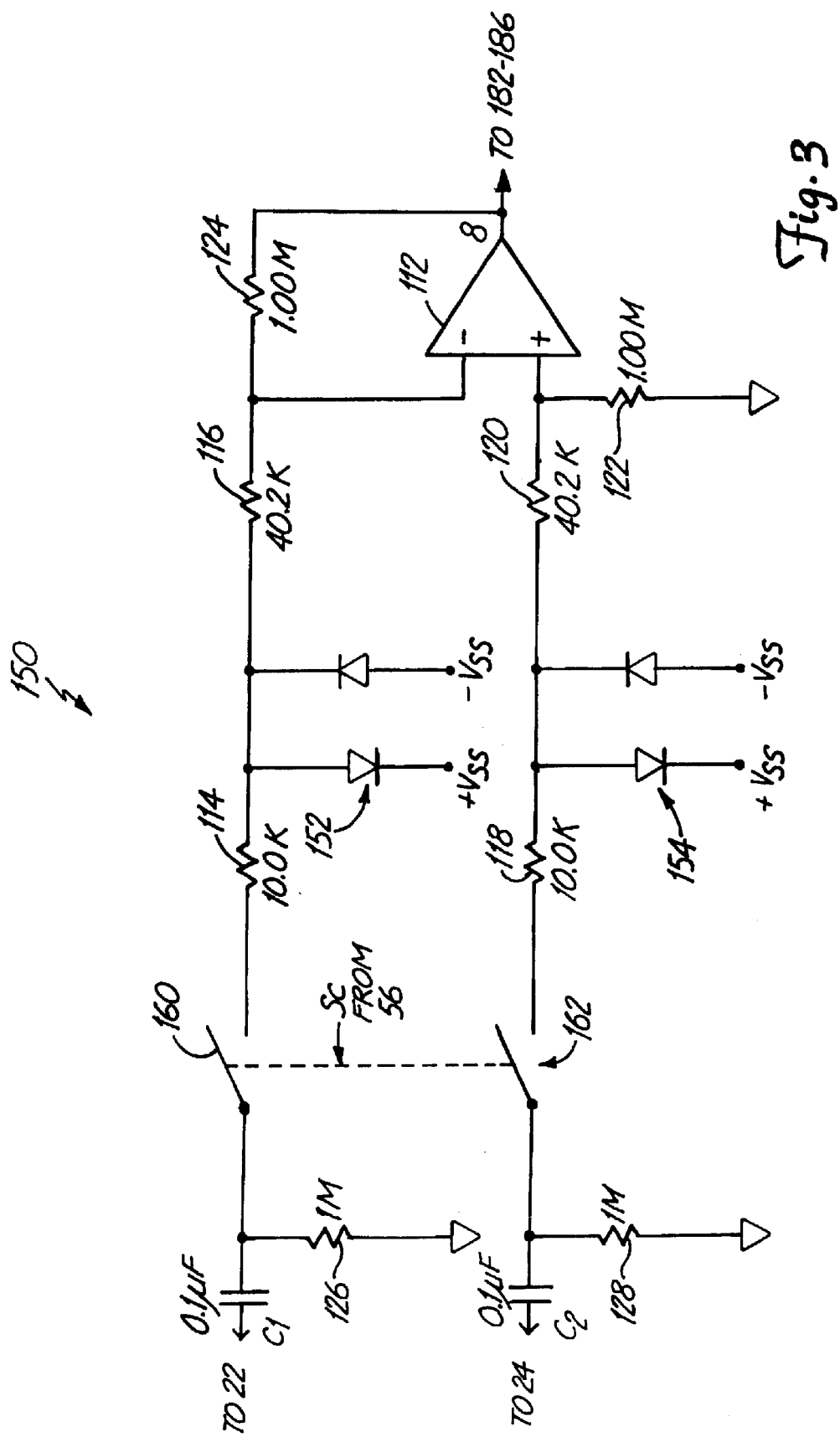
FIG. 3 is a simplified electrical schematic diagram of a portion of sense circuitry shown in FIG. 1.

Another source of inaccuracy due to noise in the system is the variability in the voltage bias at the inputs of capacitors C1 and C2 which arises due to he inductive coupling of the pulse generated by source 50 to the voltage sense leads which couple circuitry 52 to battery 12. This causes relatively large voltage spikes in the connection leads which could damage the sense circuitry leading to inaccurate readings. Diode pairs 152 and 154 are provided as input protection devices to eliminate this and exasterbate this problem by tying one side of capacitor C1 and C2 to a power supply rail through an extremely low impedance path (the forward diode direction). In order to overcome this problem, switches 160 and 162 are provided which selectively as shown in FIG. 3 couple capacitors C1 and C2 to resistors 114 and 118, respectively. Switches 160 and 162 may comprise, for example, FETs which are controlled by microprocessor 56. Microprocessor 56 controls switches 160 and 162 to provide an open circuit during the occurrence of any voltage that exceeds the value of the power supply rails. Leakage is only about 1 nanoamp. This allows capacitors C1 and C2 to "free wheel" during a voltage spike with no resultant in charging.

Figure 4:
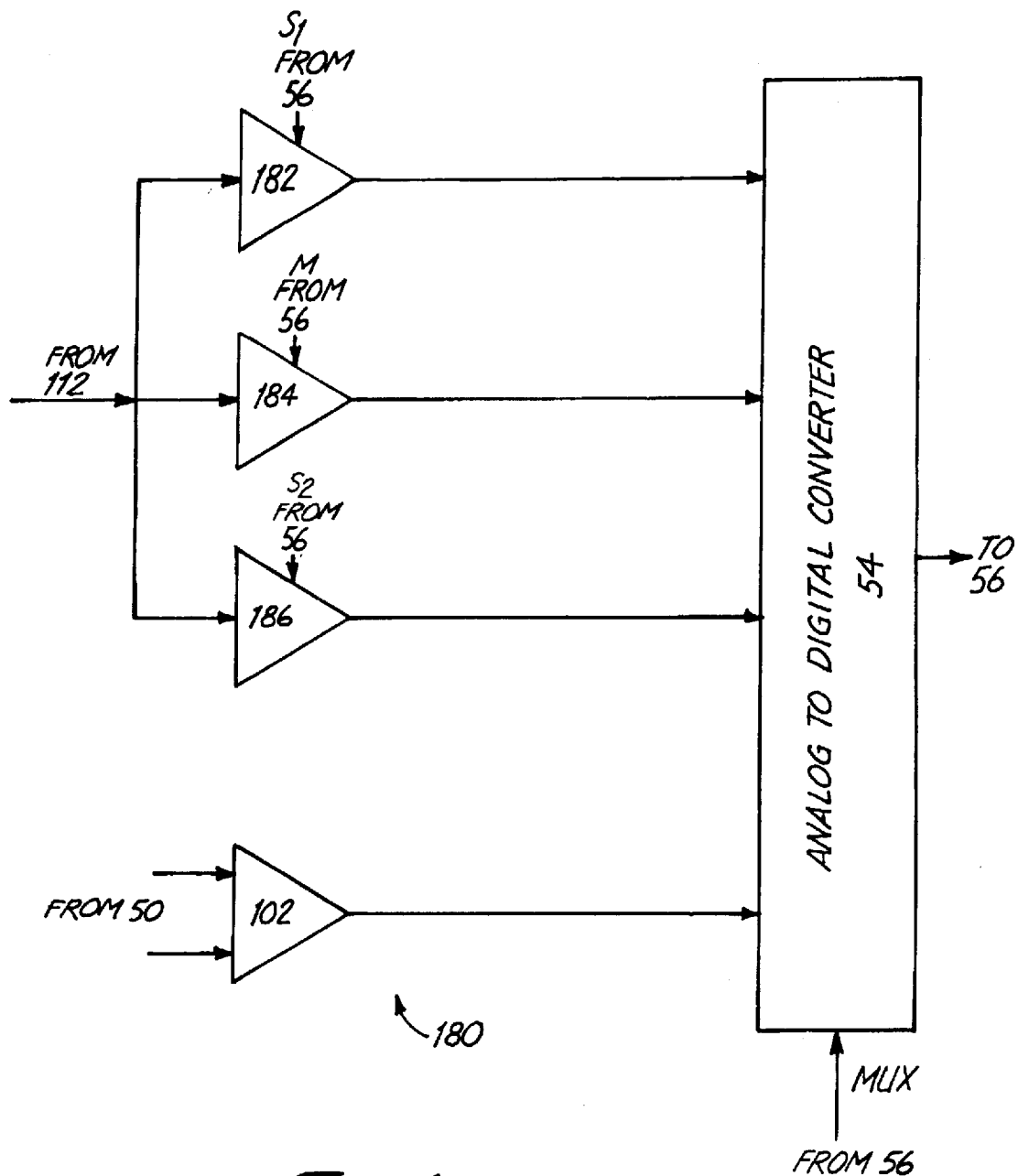
FIG. 4 is a simplified electrical schematic diagram of a portion of sense circuitry shown in FIG. 1.

Another aspect of the invention includes the determination of the quiescent operating point of the battery voltage during application of the current pulse from source 50. It is desirable to exactly determine this applicating point. However, this is not possible because the current pulse has changed the operating point by an amount inversely proportional to the conductance. Additionally, the quiescent point varies according to the AC or DC noise which is present on the system. The present invention estimates the quiescent operating point during the current pulse by taking samples before and after the current pulse and averaging the difference. FIG. 4 is a simplified electrical schematic diagram of circuitry 180 which is part of circuitry 52 shown in FIG. 1. Circuitry 180 includes circuitry 52 as shown in FIG. 1. Circuitry 180 includes three sample and hold elements 182, 184 and 186 which couples to amplifier 112 shown in FIGS. 2 and 3. Additionally, sample and hold circuits 182 through 186 receive control signals $S_1$, M, and $S_2$ from microprocessor 56. The output from amplifier 102 is also shown connected to analog to digital converter 54. Analog to digital converter 54 includes a multiplex input which is controlled by MUX line from microprocessor 56 to select one of the inputs from amplifier 102 or sample and hold circuits 182 through 186.

Figure 5:
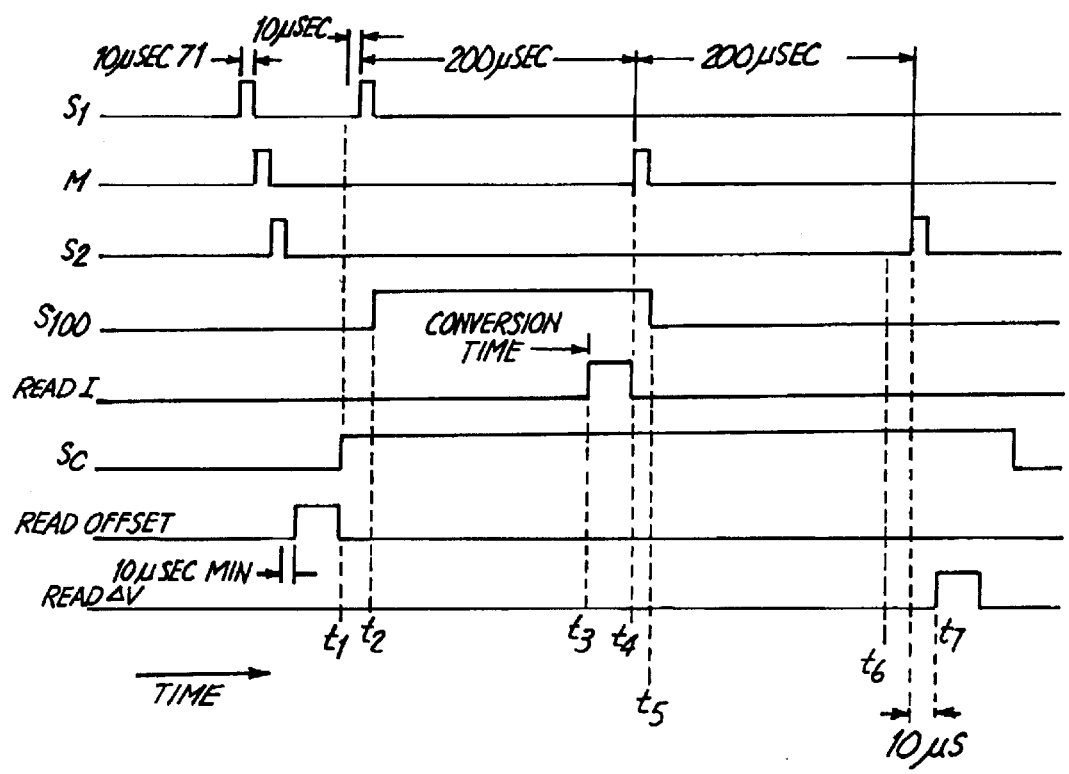
FIG. 5 is a timing diagram showing various signals during operation of the circuitry of FIGS. 1 through 4.

FIG. 5 is a timing diagram showing operation of the circuitry in FIGS. 1 through 4. Signal $S_1$ is applied by microprocessor 56 to sample and hold circuit 182, signal M is applied to sample and hold circuit 184 and signal $S_2$ is applied to circuit 186 shown in FIG. 4. Signal $S_{100}$ controls switch 100 shown in FIG. 1. The READ I signal couples analog to digital converter 54 to amplifier 102 to thereby read the voltage drop across resistance $R_L$. The $S_C$ signal controls switches 160 and 162 shown in FIG. 3. The READ OFFSET signal controls analog to digital converter 54 to initially read offsets from sample and hold 182 through 186. The read ΔV signal controls reading of the sample and hold circuits 182 through 186 with the A/D 54 following a measurement cycle. During operation, the values of the three sample and holds are initially latched using the first pulse shown in signals $S_1$, M, and $S_2$. During this initial reading, switches 160 and 162 are open such that the voltages $V^0{}_{S1}$, $V^0{}_M$, $V^0{}_{S2}$ present on these latches constitute offset values. These offsets are stored in memory 60 and subtracted from subsequent voltage measurements by microprocessor 56 to thereby reduce errors. At time $t_1$ switches 160 and 162 are closed by signal $S_C$ and sample and hold circuit 182 is again latched using signal $S_1$ to store the first measured voltage $V_1$. At time $t_2$, current I is applied to battery 12 by closing switch 100 with signal $S_{100}$. After about 150 $\mu$S, the READ I is used to control A/D converter 54 to read the voltage output from amplifier 102. At time $t_4$, sample and hold circuit 184 is triggered by signal M to store the current voltage $V_M$ across battery 12. At time $t_5$, the current I is removed from battery 12 and after a settling period of approximately 200 $\mu$S, sample an, hold circuit 186 is triggered by signal $S_2$ to store $V_2$. At time $t_7$, the A/D converter 54 to convert the voltage difference of the sample stored in circuits 182 and 186 In various embodiments, this difference may be determined using analog subtraction techniques or digital subtraction using microprocessor 56. The change in voltage of the battery due to applied current I is then calculated using the formula:

$$\Delta V = \frac{[(V_1 - V_1^0) + (V_2 - V_2^0)]}{2} - (V_M - V_M^0) \qquad \text{Equation 3}$$

G is then determined using the formula:

$$G = \frac{(V_M - V_M^0)/R_L}{\Delta V} \qquad \text{Equation 4}$$

As can be seen in Equations 3 and 4, the offset values $V^0{}_1$, $V^0{}_2$ and $V^0{}_M$ are subtracted from the measured values to thereby remove any systems offsets.

Another source of errors in measurement in noisy environments is due to lumped sum non-linearities in the circuit. In general, the equation for conductance is G=I/V, where G represents the conductance in mhos, I represents the current differential in amps and V represents the voltage differential in volts. Non-linearities in circuit 16 may cause a small offset component in the measured value of V. This offset may be determined during manufacture or during later calibration of circuitry 16 by forcing the input to circuitry 16 to 0 volts and measuring the resultant voltage. This voltage value (X) is stored in memory 60 and used to modify the equation for conductance by subtracting the offset from all measurements G=I/(V-X).

In another aspect of the invention, non-linearities in circuitry 16 are compensated or "linearized" using a second order polynomial equation. Such non-linearities may be due to many factors including cabling, PCB layout, magnetic effects, etc. The polynomial is determined by measuring a plurality of calibrated standards using an uncalibrated tester 16 and the resultant data is fit to a curve using curve fitting techniques. For example, Table 1 is a series of measurements of seven different test cells having known voltage and conductance values by a battery tester prior to such calibration:

TABLE 1

| CELL | VOLTS | MEASURED MHOS | ACTUAL MHOS | % ERROR |
|---|---|---|---|---|
| 1 | 4.40 | 648 | 800.73 | +23.57 |
| 2 | 4.40 | 1080 | 1333.33 | +23.46 |
| 3 | 4.42 | 1638 | 2000.16 | +22.11 |
| 4 | 4.42 | 2194 | 2665.10 | +21.47 |
| 5 | 4.42 | 3341 | 4000.00 | +19.72 |
| 6 | 4.44 | 5107 | 6001.68 | +17.52 |
| 7 | 4.44 | 6968 | 7995.52 | +14.75 |

Using a least squares curve fitting technique, a quadratic equation of the form:

$$G_{actual} = 1.34894810^{-1} + 1.245607 G_{measured} - 1.40414210^{-5} G^2{}_{measured} \qquad \text{Equation 5}$$

Equation 5 can be used co calibrate the measured value of mhos. The three constants in Equation 5 are stored in memory 60 for use by microprocessor 56.

Another technique of the present invention to overcome problems associated with noise includes employing statistical algorithms in microprocessor 56. Amplifier 12 is instantly able to take readings at any point, regardless of prior disturbance of the quiescent operating point due to noise, in other words, quiescent disturbances do not require a long "settling period" following the disturbance before another reading can be taken. If the noise signal remains linear and continuous, readings can be taken during the noise signal itself. However, difficulties arise in very high noise environments, where the noise is of large value, and not linear or continuous (for example, UPS switching currents). This "impulse" noise present during the measurement period causes incorrect values to be recorded for that sample, even though they do not affect the ability of the amplifier to take another sample immediately following it. Noise pulses of particular concern are high amplitude, short duration, low frequency (360 Hz, for example) spikes. Since the measurement period is short (200 micro-seconds), circuit 16 can take a large number of measurements in a short period of time. In doing so, there is a high incidence of samples containing the correct value of conductance, and a lower number of samples containing corrupted data. Microprocessor 56 determines the median or mean values over a large number of samples and is thereby able to intelligently decode the correct value from the scattered measured data.

Although the present invention has been described with reference to preferred embodiments, workers skilled in the art will recognize that changes may be made in form and detail without departing from the spirit and scope of the invention.

What is claimed is:

1. An apparatus for testing a battery comprising:
   a first Kelvin connection configured to electrically couple to a positive terminal of the battery;
   a second Kelvin connection configured to electrically couple to a negative terminal of the battery;
   a signal source configured to apply a signal to the battery through the Kelvin connections;
   a voltage sensor configured to measure a voltage related to a voltage across the battery; and
   a microprocessor configured to determine a parameter of the battery based upon the signal and wherein the parameter is a function of a polynomial to compensate for non-linearities in measurements.

2. The apparatus of claim 1 wherein the parameter of the battery is related to battery conductance.

3. The apparatus of claim 1 wherein the signal source includes a resistor.

4. The apparatus of claim 1 wherein the voltage sensor includes at least one sample and hold circuit to latch a measured voltage.

5. The apparatus of claim 1 wherein an offset voltage is subtracted from the voltage sensed by the voltage sensor.

6. The apparatus of claim 1 wherein battery condition is determined as a statistical function of a plurality of signal pulses and measured voltages.

7. The apparatus of claim 6 wherein the statistical function comprises mean.

8. The apparatus of claim 6 wherein the statistical function comprises median.

9. The apparatus of claim 1 wherein the polynomial comprises a second order polynomial.

10. The apparatus of claim 1 including a memory configured to store constants of the polynomial.

11. A method of testing a battery, comprising:
applying a signal from a signal source to a battery through first and second Kelvin connections coupled to respective positive and negative terminals of the battery;
sensing a voltage across the battery through the Kelvin connections;
determining a condition of the battery based upon the applied signal and the sensed voltage of the battery; and
compensating the measurements for non-linearities in electrical circuitry as a function of a polynomial.

12. The method of claim 11 wherein determining the condition of the battery includes determining conductance of the battery.

13. The method of claim 11 wherein applying the signal pulse includes coupling a resistor to the battery.

14. The method of claim 11 including latching a sensed voltage in a sample latching a sensed voltage in a sample and hold circuit.

15. The method of claim 11 wherein determining the condition of the battery includes calculating a statistical function based upon a plurality of signal pulses and of measured voltages.

16. An apparatus for testing a battery comprising:
a first Kelvin connection configured to electrically couple to a positive terminal of the battery;
a second Kelvin connection configured to electrically couple to a negative terminal of the battery;
a signal source configured to apply a signal to the battery through the Kelvin connections;
a voltage sensor configured to measure a voltage related to a voltage across the battery; and
a microprocessor configured to calculate a statistical parameter related to a plurality of measured voltages of the battery and determine a condition of the battery based upon the applied signal and the statistical parameter of the measured voltages.

17. The apparatus of claim 16 wherein the condition of the battery is related to battery conductance.

18. The apparatus of claim 16 wherein the signal source includes a resistor.

19. The apparatus of claim 16 wherein the voltage sensor includes at least one sample and hold circuit to latch a measured voltage.

20. The apparatus of claim 16 wherein an offset voltage is subtracted from the voltage sensed by the voltage sensor.

21. The apparatus of claim 16 wherein the statistical parameter comprises mean.

22. The apparatus of claim 16 wherein the statistical parameter comprises median.

23. A method of testing a battery, comprising:
applying a signal from a signal source to a battery through first and second Kelvin connections coupled to respective positive and negative terminals of the battery;
sensing a voltage across the battery through the Kelvin connections;
determining a statistical parameter based upon a plurality of sensed voltages; and
determining a condition of the battery based upon the signal and the statistical parameter of the sensed voltages of the battery.

24. The method of claim 23 wherein determining the condition of the battery includes determining conductance of the battery.

25. The method of claim 23 wherein applying the signal pulse includes coupling a resistor to the battery.

26. The method of claim 23 including latching a sensed voltage in a sample latching a sensed voltage in a sample and hold circuit.

27. The method of claim 23 wherein the statistical parameter comprises mean.

28. The method of claim 23 wherein the statistical parameter comprises median.

* * * * *

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page,
Item [56], References Cited, U.S. PATENT DOCUMENTS, insert

| | | | |
|---|---|---|---|
| 2514745 | 7/1950 | Dalzell | 171/95. |
| 3356936 | 12/1967 | Smith | 324/29. |
| 3562634 | 2/1971 | Latner | 31/4. |
| 3593099 | 7/1971 | Scholl | 320/13. |
| 3607673 | 9/1971 | Seyl | 204/1. |
| 3676770 | 7/1972 | Sharaf et al. | 324/29. |
| 3729989 | 5/1973 | Little | 73/133. |
| 3753094 | 8/1973 | Furuisha et al. | 324/29. |
| 3808522 | 4/1974 | Sharaf | 324/29. |
| 3811089 | 5/1974 | Strezelewicz | 324/170. |
| 3873911 | 3/1975 | Champlin | 324/29. |
| 3876931 | 4/1975 | Godshalk | 324/29. |
| 3886443 | 5/1975 | Miyakawa et al. | 324/29. |
| 3889248 | 6/1975 | Ritter | 340/249. |
| 3906329 | 9/1975 | Bader | 320/44. |
| 3909708 | 9/1975 | Champlin | 324/29. |
| 3936744 | 2/1976 | Perlmutter | 324/158. |
| 3946299 | 3/1976 | Christianson et al. | 320/43. |
| 3947757 | 3/1976 | Grube et al. | 324/28. |
| 3969667 | 7/1976 | McWilliams | 324/29. |
| 3979664 | 9/1976 | Harris | 324/17. |
| 3984762 | 10/1975 | Dowgiallo, Jr. | 324/29.5 |
| 3984768 | 10/1976 | Staples | 324/62 |
| 3989544 | 11/1976 | Santo | 429/65 |
| 4008619 | 2/1977 | Alcaide eta l. | 73/398 |
| 4024953 | 5/1997 | Nailor III | 206/344 |
| 4047091 | 9/1997 | Hutchines et al. | 363/59 |
| 4053824 | 10/1977 | Dupuis et al. | 324/29.5 |
| 4070624 | 1/1978 | Taylor | 327/158 |
| 4086531 | 4/1978 | Bernier | 324/158 |
| 4112351 | 9/1978 | Back et al. | 324/16 |
| 4114083 | 9/1978 | Benham et al. | 320/39 |
| 4126874 | 11/1978 | Suzuki et al. | 354/60 |
| 4178546 | 12/1979 | Hulls et al. | 324/158 |
| 4193025 | 3/1980 | Frailing et al. | 324/427 |
| 4207611 | 6/1980 | Gordon | 364/580 |
| 4217645 | 8/1980 | Barry et al. | 364/483 |
| 4297639 | 10/1981 | Branham | 324/429 |
| 4315204 | 2/1982 | Sievers et al. | 322   28 |
| 4316185 | 2/1982 | Watrous et al. | 340/636 |
| 4322685 | 3/1982 | Frailing et al. | 324/429 |
| 4351405 | 6/1982 | Fields et al. | 180/65 |
| 4361809 | 11/1982 | Bil et al. | 324/426 |
| 4363407 | 12/1982 | Barkler et al. | 209/3. |
| 4369407 | 1/1983 | Korbell | 324/416. |
| 4379989 | 4/1983 | Kurz et al. | 320/26. |
| 4379990 | 4/1983 | Sievers et al. | 322/99. |
| 4390828 | 6/1983 | Converse et al. | 320/32. |
| 4392101 | 7/1983 | Saar et al. | 320/20. |
| 4396880 | 8/1983 | Windebank | 320/21. |
| 4408157 | 10/1983 | Beaubien | 324/62. |
| 4412169 | 10/1983 | Dell'Orto | 320/64. |
| 4423378 | 12/1983 | Marino et al. | 324/427. |
| 4423379 | 12/1983 | Jacobs et al. | 324/429. |
| 4424491 | 1/1984 | Bobbett et al. | 324/433. |
| 4459548 | 7/1984 | Lentz et al. | 324/158. |
| 4514694 | 4/1985 | Finger | 324/429. |
| 4520353 | 5/1985 | McAuliffe | 340/636. |
| 4633418 | 12/1986 | Bishop | 364/554. |

UNITED STATES PATENT AND TRADEMARK OFFICE
CERTIFICATE OF CORRECTION

PATENT NO. : 6,534,993 B2  
DATED : March 18, 2003  
INVENTOR(S) : Kevin I. Bertness It is certified that error appears in the above-identified patent and that said Letters Patent is hereby corrected as shown below:

Title page (cont'd),

| | | | |
|---|---|---|---|
| 4659977 | 4/1987 | Kissel et al. | 320/64. |
| 4663580 | 5/1987 | Wortman | 320/35 |
| 4665370 | 5/1987 | Holland | 324/429 |
| 4667143 | 5/1987 | Cooper et al. | 320/22 |
| 4667279 | 5/1987 | Maier | 363/46. |
| 4678998 | 7/1987 | Muramatsu | 324/427. |
| 4679000 | 7/1987 | Clark | 324/428. |
| 4680528 | 7/1987 | Mikami et al. | 320/32. |
| 4697134 | 9/1987 | Burkum et al. | 320/48. |
| 4707795 | 11/1987 | Alber et al. | 364/550. |
| 4709202 | 11/1987 | Koenck et al. | 320/43. |
| 4710861 | 12/1987 | Kanner | 363/46. |
| 4719428 | 1/1988 | Liebermann | 324/436. |
| 4743855 | 5/1988 | Randin et al. | 324/430. |
| 4745349 | 5/1988 | Palanisamy et al. | 320/22. |
| 4816768 | 3/1989 | Champlin | 324/428. |
| 4820966 | 4/1989 | Fridman | 320/32. |
| 4825170 | 4/1989 | Champlin | 324/436. |
| 4847547 | 7/1989 | Eng Jr. et al. | 320/35 |
| 4849700 | 7/1989 | Morioka et al. | 324/427. |
| 4876495 | 10/1989 | Palanisamy et al. | 320/18. |
| 4881038 | 11/1989 | Champlin | 324/426. |
| 4912416 | 3/1990 | Champlin | 324/430. |
| 4913116 | 4/1990 | Katogi et al. | 123/425. |
| 4929931 | 5/1990 | McCuen | 340/636. |
| 4931738 | 6/1990 | MacIntyre et al. | 324/435. |
| 4937528 | 6/1990 | Palanisamy | 324/430. |
| 4947124 | 8/1990 | Hauser | 324/430. |
| 4956597 | 9/1990 | Heavey et al. | 320/14. |
| 4968941 | 11/1990 | Rogers | 324/428. |
| 4968942 | 11/1990 | Palanasamy | 324/430. |
| 5004979 | 4/1991 | Marino et al. | 324/160. |
| 5032825 | 7/1991 | Xuznicki | 340/636. |
| 5037778 | 8/1991 | Stark et al. | 437/216 |
| 5047722 | 9/1991 | Wurst et al. | 324/430. |
| 5087881 | 2/1992 | Peacock | 324/378. |
| 5095223 | 3/1992 | Thomas | 307/110 |
| 5126675 | 6/1992 | Yang | 324/435. |
| 5140269 | 8/1992 | Champlin | 324/433. |
| 5144218 | 9/1992 | Bosscha | 320/44. |
| 5144248 | 9/1992 | Alexandres et al. | 324/428. |
| 5160881 | 11/1992 | Schramm et al. | 322/7. |
| 5170124 | 12/1992 | Blair etal. | 324/434. |
| 5179335 | 1/1993 | Nor | 320/21. |
| 5194799 | 3/1993 | Tomantschger | 320/2 |
| 5204611 | 4/1993 | Nor et al. | 320/21. |
| 5214370 | 5/1993 | Harm et al. | 320/35. |
| 5214385 | 5/1993 | Gabriel et al. | 324/434. |
| 5241275 | 8/1993 | Fang | 324/430. |
| 5254952 | 10/1993 | Salley et al. | 324/429. |
| 5266880 | 11/1993 | Newland | 320/14. |
| 5281919 | 1/1994 | Palanisamy | 324/427. |
| 5281920 | 1/1994 | Wurst | 324/430. |
| 5295078 | 3/1994 | Stich et al. | 364/483. |
| 5298797 | 3/1994 | Redl | 307/246. |
| 5300874 | 4/1994 | Shimamoto et al. | 320/15. |
| 5302902 | 4/1994 | Groehl | 324/434. |
| 5315287 | 5/1994 | Sol | 340/455. |
| 5321626 | 6/1994 | Palladino | 364/483. |
| 5331268 | 7/1994 | Patino et al. | 320/20. |
| 5336993 | 8/1994 | Thomas et al. | 324/158. |
| 5338515 | 8/1994 | Dalla Betta et al. | 422/95. |
| 5339018 | 8/1994 | Brokaw | 320/35. |
| 5343380 | 8/1994 | Champlin | 363/46. |
| 5347163 | 9/1994 | Yoshimura | 307/66. |

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page (cont'd),

| | | | |
|---|---|---|---|
| 5352968 | 10/1994 | Reni et al. | 320/35. |
| 5365160 | 11/1994 | Leppo et al. | 320/22. |
| 5365453 | 11/1994 | Startup et al. | 364/481. |
| 5381096 | 1/1995 | Hirzel | 324/427. |
| 5412323 | 5/1995 | Kato et al. | 324/429. |
| 5426371 | 6/1995 | Salley et al. | 324/429. |
| 5426416 | 6/1995 | Jefferies et al. | 340/664. |
| 5432426 | 7/1995 | Yoshida | 320/20. |
| 5434495 | 7/1995 | Toko | 320/44. |
| 5435185 | 7/1995 | Eagan | 73/587 |
| 5442274 | 8/1995 | Tamai | 320/23. |
| 5445026 | 8/1995 | Eagan | 73/591 |
| 5449996 | 9/1995 | Matsumoto et al. | 320/20. |
| 5449997 | 9/1995 | Gilmore et al. | 320/39. |
| 5451881 | 9/1995 | Finger | 324/433. |
| 5457377 | 10/1995 | Jonsson | 320/5. |
| 5469043 | 11/1995 | Cherng et al. | 320/31. |
| 5485090 | 1/1996 | Stephens | 324/433. |
| 5488300 | 1/1996 | Jamieson | 324/432. |
| 5519383 | 5/1996 | De La Rosa | 340/636. |
| 5528148 | 6/1996 | Rogers | 324/426. |
| 5537967 | 7/1996 | Tashiro et al. | 123/792. |
| 5546317 | 8/1996 | Andrieu | 364/481. |
| 5548273 | 8/1996 | Nicol et al. | 340/439. |
| 5550485 | 8/1996 | Falk | 324/426. |
| 5561380 | 10/1996 | Sway-Tin et al. | 324/509. |
| 5562501 | 10/1996 | Kinoshita et al. | 439/852. |
| 5572136 | 11/1996 | Champlin | 324/426. |
| 5574355 | 11/1996 | McShane et al. | 324/430. |
| 5574355 | 11/1996 | McShane et al. | 320/39 |
| 5583416 | 12/1996 | Klang | 320/22. |
| 5585728 | 12/1996 | Champlin | 324/427. |
| 5589757 | 12/1996 | Klang | 320/22. |
| 5592093 | 1/1997 | Klingbiel | 324/426. |
| 5596260 | 1/1997 | Moravec et al. | 320/30. |
| 5598098 | 1/1997 | Champlin | 324/430. |
| 5602462 | 2/1997 | Stich et al. | 323/258. |
| 5606242 | 2/1997 | Hull et al. | 320/48. |
| 5621298 | 4/1997 | Harvey | 320/5. |
| 5633985 | 5/1997 | Severson et al. | 395/2. |
| 5637978 | 6/1997 | Kellett et al. | 320/2 |
| 5642031 | 6/1997 | Brotto | 320/21. |
| 5650937 | 7/1997 | Bounaga | 364/483. |

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page (cont'd),

| | | | |
|---|---|---|---|
| 5652501 | 7/1997 | McClure et al. | 320/17. |
| 5653659 | 8/1997 | Kunibe et al. | 477/111 |
| 5653659 | 8/1997 | Kunibe et al. | 477/111 |
| 5656920 | 8/1997 | Cherng et al. | 320/31. |
| 5675234 | 10/1997 | Greene | 320/15. |
| 5677077 | 10/1997 | Faulk | 429/90. |
| 5699050 | 12/1997 | Kanazawa | 340/636. |
| 5701089 | 12/1997 | Perkins | 327/772. |
| 5705929 | 1/1998 | Caravello et al. | 324/430. |
| 5710503 | 1/1998 | Sideris et al. | 320/6. |
| 5711648 | 1/1998 | Hammerslag | 414/786 |
| 5717336 | 2/1998 | Basell et al. | 324/430. |
| 5717937 | 2/1998 | Fritz | 395/750. |
| 5739667 | 4/1998 | Matsuda et al. | 320/5. |
| 5747909 | 5/1998 | Syverson et al. | 310/156. |
| 5754417 | 5/1998 | Nicollini | 363/60 |
| 5757192 | 5/1998 | McShane et al. | 324/427. |
| 5760587 | 6/1998 | Harvey | 324/434. |
| 5773978 | 6/1998 | Becker | 324/430. |
| 5789899 | 8/1998 | van Phuoc et al. | 320/30. |
| 5793359 | 8/1998 | Ushikubo | 345/169. |
| 5808469 | 9/1998 | Kopera | 324/43. |
| 5818234 | 10/1998 | McKinnon | 324/433 |
| 5821756 | 10/1998 | McShane et al. | 324/430. |
| 5825174 | 10/1998 | Parker | 324/106. |
| 5831435 | 11/1998 | Troy | 324/426. |
| 5862515 | 1/1999 | Kobayashi et al. | 702/63. |
| 5872443 | 2/1999 | Williamson | 320/21. |
| 5895440 | 4/1999 | Proctor et al. | 702/63. |
| 5914605 | 6/1999 | Bertness | 324/430. |
| 5927938 | 7/1999 | Hammerslag | 414/809 |
| 5929609 | 7/1999 | Joy et al. | 322/25. |
| 5939855 | 8/1999 | Proctor et al. | 320/104. |
| 5939861 | 8/1999 | Joko et al. | |
| 5945829 | 8/1999 | Bertness | 324/430. |
| 5951229 | 9/1999 | Hammerslag | 414/398 |
| 5961561 | 10/1999 | Wakefield II | 701/29 |
| 5961604 | 10/1999 | Anderson et al. | 709/229 |
| 5969625 | 10/1999 | Russo | 340/636. |
| 6002238 | 12/1999 | Champlin | 320/134. |
| 6008652 | 12/1999 | Theofanopoulos et al. | 324/434. |
| 6009369 | 12/1999 | Boisvert et al. | 701/99. |
| 6031354 | 2/2000 | Wiley et al. | 320/116. |
| 6037751 | 3/2000 | Klang | 320/160. |
| 6037777 | 3/2000 | Champlin | 324/430. |
| 6051976 | 4/2000 | Bertness | 324/426. |
| 6072299 | 6/2000 | Kurie et al. | 320/112. |
| 6072300 | 6/2000 | Tjusi | 320/116. |
| 6081098 | 6/2000 | Bertness et al. | 320/134. |
| 6091245 | 7/2000 | Bertness | 324/426. |
| 6094033 | 7/2000 | Ding et al. | 320/132. |
| 6104167 | 8/2000 | Bertness et al. | 320/132. |
| 6114834 | 9/2000 | Parise | 320/109. |
| 6137269 | 10/2000 | Champlin | 320/150. |
| 6140797 | 10/2000 | Dunn | 320/105 |
| 6144185 | 11/2000 | Dougherty et al. | 320/132 |
| 6150793 | 11/2000 | Lesesky et al. | 320/104. |
| 6161640 | 12/2000 | Yamaguchi | 180/65.8 |
| 6163156 | 12/2000 | Bertness | 324/426. |
| 6172483 | 1/2001 | Champlin | 320/134. |
| 6172505 | 1/2001 | Bertness | 324/430. |
| 6181545 | 1/2001 | Amatucci et al. | 361/502 |
| 6222369 | 4/2001 | Champlin | 324/430. |
| 6225808 | 5/2001 | Varghese et al. | 324/426. |
| 6236332 | 5/2001 | Conkright et al. | 340/825.06 |
| 6249124 | 6/2001 | Bertness | 324/426. |
| 6250973 | 6/2001 | Lowery et al. | 439/763 |
| 6254438 | 7/2001 | Gaunt | 439/755 |
| 6259254 | 7/2001 | Klang | 324/427. |
| 6262563 | 7/2001 | Champlin | 320/134. |

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page (cont'd),

| | | | |
|---|---|---|---|
| 6294896 | 9/2001 | Champlin | 320/134. |
| 6294897 | 9/2001 | Champlin | 320/153. |
| 6304087 | 10/2001 | Bertness | 324/426 |
| 6307349 | 10/2001 | Koenck et al. | 320/112 |
| 6310481 | 10/2001 | Bertess | 324/430 |
| 6313607 | 11/2001 | Champlin | 320/132 |
| 6313608 | 11/2001 | Varghese et al. | 32/132 |
| 6316914 | 11/2001 | Bertness | 320/134 |
| 6323650 | 11/2001 | Bertness et al. | 324/426 |
| 6329793 | 12/2001 | Bertness et al. | 320/132 |
| 6331762 | 12/2001 | Bertness | 320/134 |
| 6332113 | 12/2001 | Bertness | 702/63 |
| 6346795 | 2/2002 | Haraguchi et al. | 320/136 |
| 6347958 | 2/2002 | Tsai | 439/488 |
| 6351102 | 2/2002 | Troy | 320/139 |
| 6351102 | 2/2002 | Troy | 320/139 |
| 6359441 | 3/2002 | Bertness | 324/426 |
| 6359441 | 3/2002 | Bertness | 324/426 |
| 6363303 | 3/2002 | Bertness | 701/29 |
| 6384608 | 5/2002 | Namaky | 324/425 |
| 6388448 | 5/2002 | Cervas | 324/426 |
| 6392414 | 5/2002 | Bertness | 324/429 |
| 6411098 | 6/2002 | Laletin | 324/436 |
| 6417669 | 7/2002 | Champlin | 324/426 |
| 6424158 | 7/2002 | Klang | 324/433 |
| 6441585 | 8/2002 | Bertness | 320/132 |
| 6445158 | 9/2002 | Bertness et al. | 320/104 |
| 6456045 | 9/2002 | Troy et al. | 320139 |

FOREIGN PATENT DOCUMENTS

| | | |
|---|---|---|
| DE | 29 26 716 | 1/1981 |
| EP | 0 022 450 | 1/1981 |
| EP | 0 637 754 | 2/1995 |
| EP | 0 772 056 | 5/1997 |
| FR | 2 749 397 | 12/1997 |
| GB | 2 088 159 | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015-C1 | 8/1997 |
| WO | 93/22666 | 11/1993 |
| WO | 94/05069 | 3/1994 |
| WO | 98/58270 | 12/1998 |
| WO | 99/23738 | 5/1999 |

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page (cont'd),
OTHER PUBLICATIONS,

Internal Resistance : Harbinger of Capacity Loss in Starved Electrolyte Sealed Lead Acid Batteries, by Vaccaro, F.J. et al., AT&T Bell Laboratories, 1987 IEEE, Ch. 2477 pp. 128,131.

IEEE Recommended Practice For Maintenance, Testings, and Replacement of Large Lead Storage Batteries for Generating Stations and Substations, The Institute of Electrical and Electronics Engineers, Inc., ANSI/IEEE Std. 450-1987, Mar. 3, 1987, pp. 7-15.

"Field and Laboratory Studies to Assess the State of Health of Valve-Regulated Lead Acid Batteries: Part I Conductance/Capacity Correlation Studies", by D. Feder et al., IEEE Aug. 1992, pp. 218-233.

"Battery Impedance", by E. Willihnganz et al., Electrical Engineering, Sep. 1959, pp. 922-925.

"JIS Japanese Industrial Standard-Lead Acid Batteries for Automobiles", Japanese Standards Association UDC, 621.355.2:626.113.006, Nov. 1995.

"Performance of Dry Cells", by C. Hambuechen, Preprint of Am. Electrochem. Soc., Apr. 18-20, 1912, paper No. 19, pp. 1-5.

"A Bridge for Measuring Storage Battery Resistance", by E. Willihncanz, The Electrochemical Society, preprint 79-20, Apr. 1941, pp. 253-258.

National Semiconductor Corporation, "High Q Notch Filter", 3/69, Linear Brief 5, Mar. 1969.

Burr-Brown Corporation, "Design A 60 Hz Notch Filter with the UAF42", 1/94, AB-071, 1994.

National Semiconductor Corporation, "LMF90-4.sup.th -Order Elliptic Notch Filter", 12/94, RRD-B30M115, Dec. 1994.

"Electrochemical Impedance Spectroscopy in Battery Development and Testing",Batteries International, Apr. 1997, pp. 59 and 62-63.

"Determining The End of Battery Life", by S. DeBardelaben, IEEE, 1986, pp. 365-368.

"A Look at the Impedance of a Cell", by S. Debardelaben, IEEE, 1988, pp. 394-397.

"The Impedance of Electrical Storage Cells", by N.A. Hampson et al., Journal of Applied Electrochemistry, 1980, pp. 3-11.

"A Package for Impedance/Admittance Data Analysis", by B. Boukamp, Solid State Ionics, 1986, pp. 136-140.

"Precision of Impedance Spectorscopy Estimates of Bulk, Reaction Rate, and Diffusion Parameters", by J. Macdonald et al., J. Electroanal, Chem., 1991, pp. 1-11.

"Alligator Clips with Wire Penetrators" J.S. Popper, Inc. product information, downloaded from http://www.jspopper.com/, undated "#12: LM78S40 Simple Switcher DC to DC Converter", ITM e-Catalog, downloaded from http://www.pcbcafe.com, undated

UNITED STATES PATENT AND TRADEMARK OFFICE
CERTIFICATE OF CORRECTION

PATENT NO. : 6,534,993 B2
DATED : March 18, 2003
INVENTOR(S) : Kevin I. Bertness It is certified that error appears in the above-identified patent and that said Letters Patent is hereby corrected as shown below:

Title page (cont'd),

"Simple DC-DC Converts Allows Use of Single Battery", Electronix Express, downloaded from http://www.elexp.com/t_dc-dc.htm, undated "DC-DC Converter Basics", Power Designers, downloaded from http://www.powederdesigners.com/InforWeb.design_center/articles/DC-DC/converter.shtm, undated --

Signed and Sealed this

Fourteenth Day of September, 2004

JON W. DUDAS
*Director of the United States Patent and Trademark Office*